(12) United States Patent
Uogishi et al.

(10) Patent No.: US 10,966,315 B2
(45) Date of Patent: Mar. 30, 2021

(54) ELECTRONIC DEVICE AND FLEXIBLE PRINTED CIRCUIT BOARD

(71) Applicant: Japan Display Inc., Minato-ku (JP)

(72) Inventors: Kota Uogishi, Tokyo (JP); Keisuke Asada, Tokyo (JP); Hideaki Abe, Tokyo (JP); Kazuyuki Yamada, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/906,124

(22) Filed: Jun. 19, 2020

(65) Prior Publication Data

US 2020/0404773 A1    Dec. 24, 2020

(30) Foreign Application Priority Data

Jun. 19, 2019   (JP) .............................. JP2019-113701

(51) Int. Cl.
| | | |
|---|---|---|
| *H05K 1/00* | (2006.01) | |
| *H05K 1/02* | (2006.01) | |
| *H05K 1/18* | (2006.01) | |

(52) U.S. Cl.
CPC ............. *H05K 1/028* (2013.01); *H05K 1/189* (2013.01); *H05K 2201/10128* (2013.01)

(58) Field of Classification Search
CPC ................... H05K 1/028; H05K 1/189; H05K 2201/10128
USPC ......................................................... 361/749
See application file for complete search history.

(56) References Cited

U.S. PATENT DOCUMENTS 6,636,281 B1   10/2003 Kanatsu

FOREIGN PATENT DOCUMENTS

| JP | 2001-083897 A | 3/2001 |
| JP | 2003-243778 A | 8/2003 |

*Primary Examiner* — Tremesha S Willis
(74) *Attorney, Agent, or Firm* — Oblon, McClelland, Maier & Neustadt, L.L.P.

(57) ABSTRACT

According to one embodiment, an electronic device includes a panel including a mounting edge and pad portions, a flexible printed circuit board mounted on the panel. The flexible printed circuit board includes a base member including a first surface and a second surface, wiring lines placed on a side of the first surface and a protective layer covering the wiring lines, and including a bent portion, the base member includes a groove portion located in the bend portion and formed in the second surface, the groove portion includes concavity portions extending along a second direction and arranged along the first direction, and a thickness of the base member in a site where the groove portion is formed is less than a thickness of the base member in a site overlapping the driver IC chip.

24 Claims, 13 Drawing Sheets

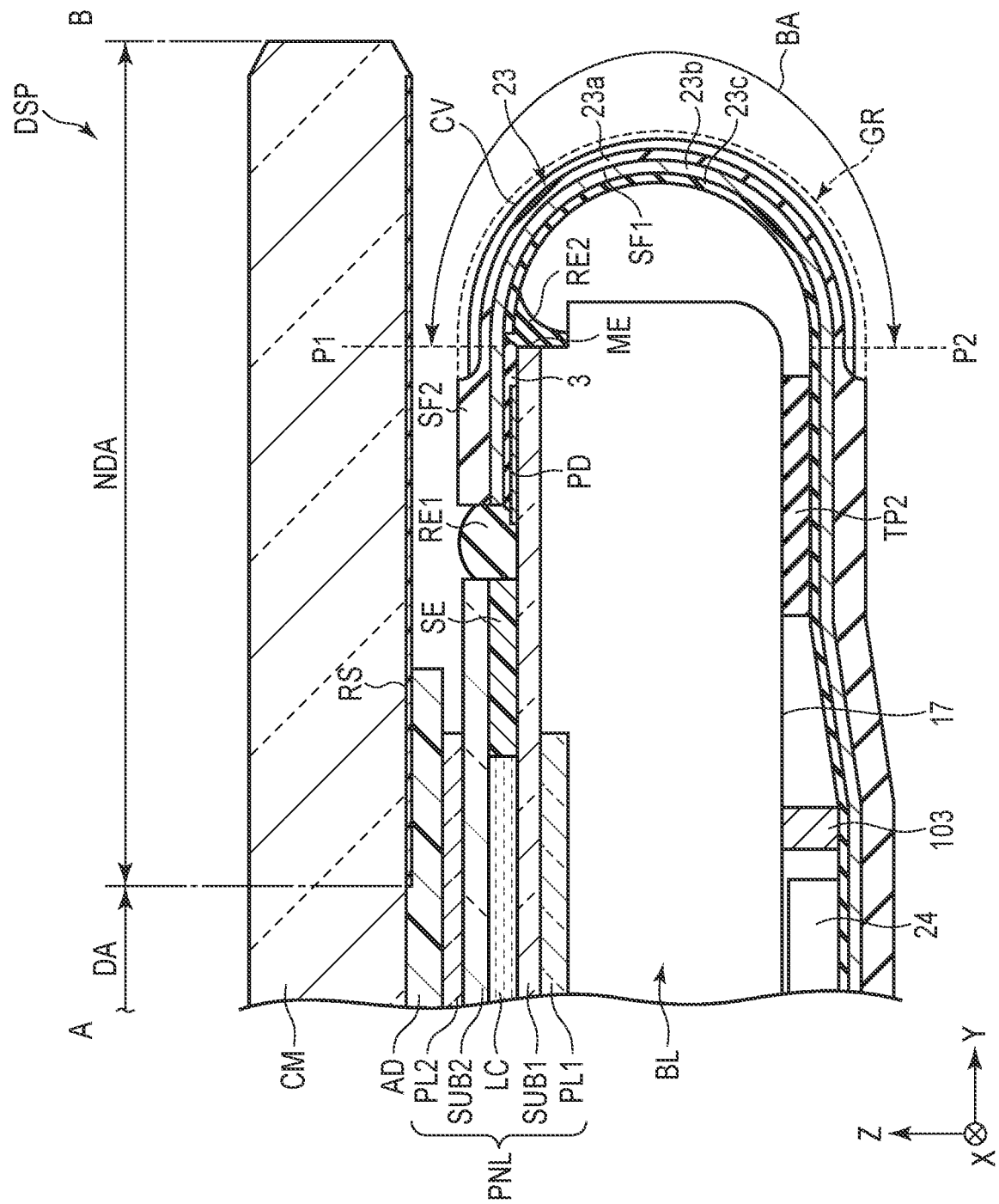
F I G. 3

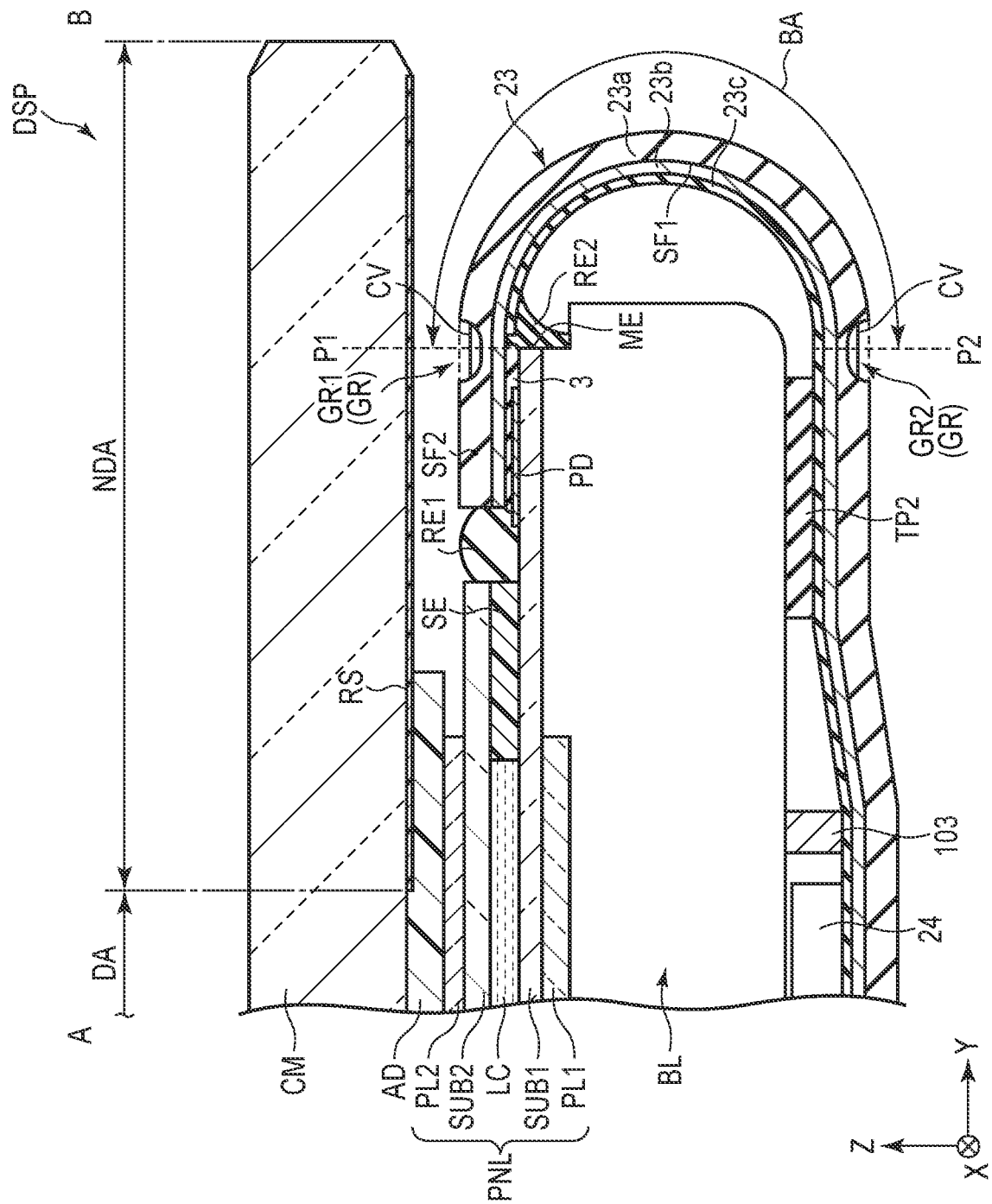
F I G. 5

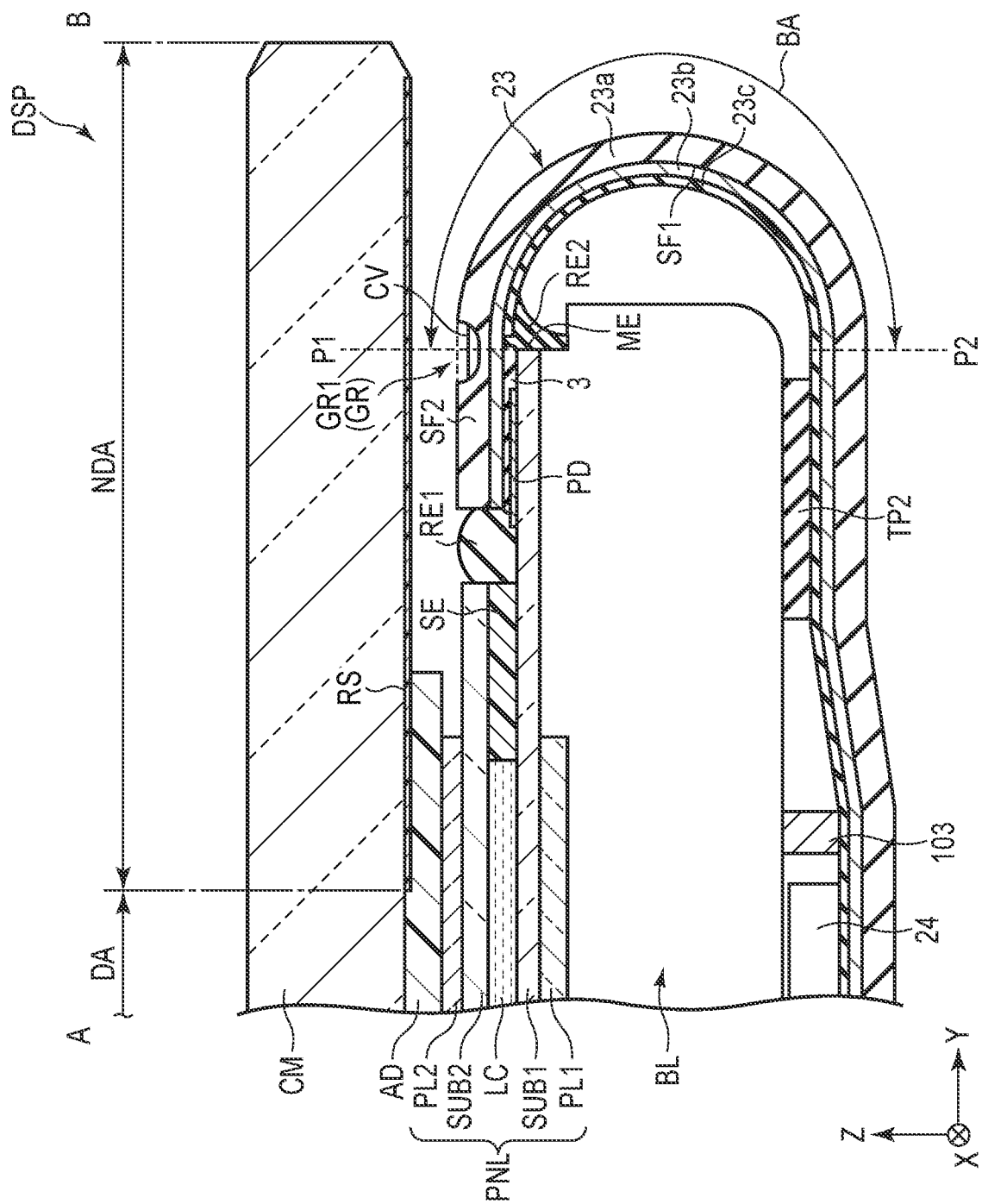
F I G. 7

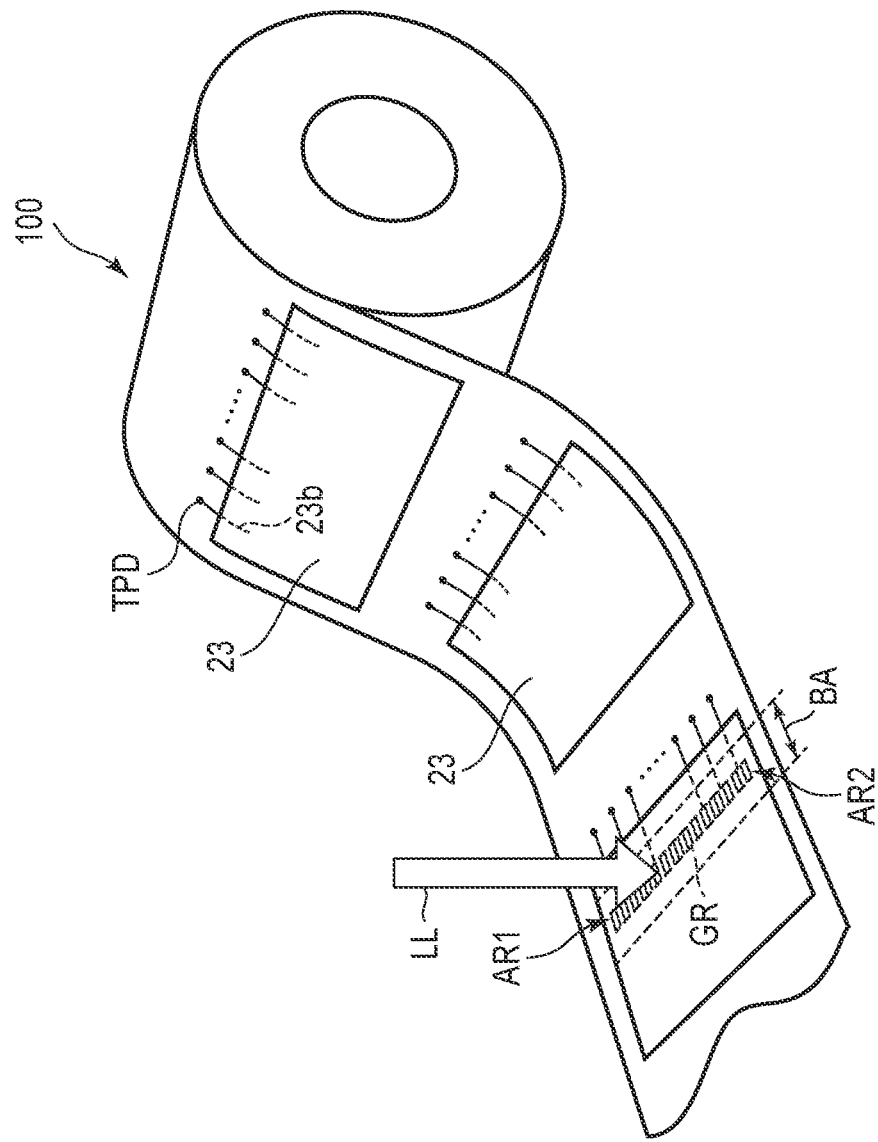
F I G. 11

ELECTRONIC DEVICE AND FLEXIBLE PRINTED CIRCUIT BOARD

CROSS-REFERENCE TO RELATED APPLICATIONS

This application is based upon and claims the benefit of priority from Japanese Patent Application No. 2019-113701, filed Jun. 19, 2019, the entire contents of which are incorporated herein by reference.

FIELD

Embodiments described herein relate generally to an electronic device and a flexible printed circuit board.

BACKGROUND

As display devices, which are electronic devices such as smartphones, tablet computers and car navigation systems, liquid crystal display devices, organic EL display devices and the like are widely used. The display devices comprise a display panel and a flexible printed circuit board (FPC) mounted on the display panel. The FPC extends outward from the display panel, and is bent in, for example, a rear surface side of the display panel.

The FPC comprises a base film, wiring lines on the base film and a covering film for protecting the wiring lines. For example, such a technique is conventionally known that to form a plurality of grooves are formed in a covering film in order to reduce repulsion occurring in bending of an FPC. However, of the base film, the wiring lines and the covering film described above, the influence of the covering film which causes in the repulsion of the FPC is not significant. Therefore, it is difficult to sufficiently reduce the repulsion of the FPC by forming grooves in the covering film.

Meanwhile, such a display panel is known that comprises a tape carrier package (TCP) with one end connected to the display device and the other end connected to the circuit board. The TCP, as in the case of the FPC described above, comprises a base film, a copper foil on the base film and a resist film covering the copper foil. For example, a plurality of slits which penetrate the base film are formed in a bend portion of the TCP in order to reduce the release force to be applied the junction between the TCP and the display panel.

BRIEF DESCRIPTION OF THE DRAWINGS

FIG. 3 is a cross sectional view of the display device taken along a line A-B in FIG. 2.

FIG. 5 is a cross-sectional view of a display device according to the second embodiment.

FIG. 7 is a cross-sectional view of a display device according to the second embodiment.

FIG. 11 is a diagram showing the first example of a process of forming grooves in a flexible printed circuit board.

DETAILED DESCRIPTION

In general, according to one embodiment, an electronic device comprises a panel comprising a mounting edge extending along a first direction and a plurality of pad portions arranged along the mounting edge; a flexible printed circuit board mounted on the panel and overlapping the plurality of pad portions; and a driver IC chip mounted on the flexible printed circuit board and configured as a signal supply source which supplies a signal necessary to drive the panel, the flexible printed circuit board comprising a base member comprising a first surface and a second surface on an opposite side to the first surface, wiring lines placed on a side of the first surface of the base member and a protective layer covering the wiring lines, and including a bent portion which can be bent, the base member comprising a groove portion located in the bend portion and formed in the second surface, the groove portion comprising a plurality of concavity portions extending along a second direction intersecting the first direction and arranged along the first direction, and a thickness of the base member in a site where the groove portion is formed being less than a thickness of the base member in a site overlapping the driver IC chip.

According to another embodiment, a flexible printed circuit board comprises a driver IC chip extending along a first direction; a bend portion being bendable and comprising a base member including a first surface and a second surface on an opposite side to the first surface, wiring lines located on a side of the first surface of the base member and a protective layer covering the wiring lines, the base member comprising a groove portion located in the bend portion and formed in the second surface, the groove portion comprising a plurality of concavity portions extending along a second direction intersecting the first direction, and arranged along the first direction, and a thickness of the base member in a site where the groove is formed being less than a thickness of the base member in a site overlapping the driver IC chip.

Embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. Further, a width, thickness, shape, and the like of each element are depicted schematically in the Figures as compared to actual embodiments for the sake of simpler explanation, and they are not to limit the interpretation of the invention of the present application. Furthermore, in the specification and drawings, constituent elements having the same or similar functions as those described in connection with preceding drawings are First, the first embodiment will be described with reference to FIGS. 1 to 4.

Figure 1:
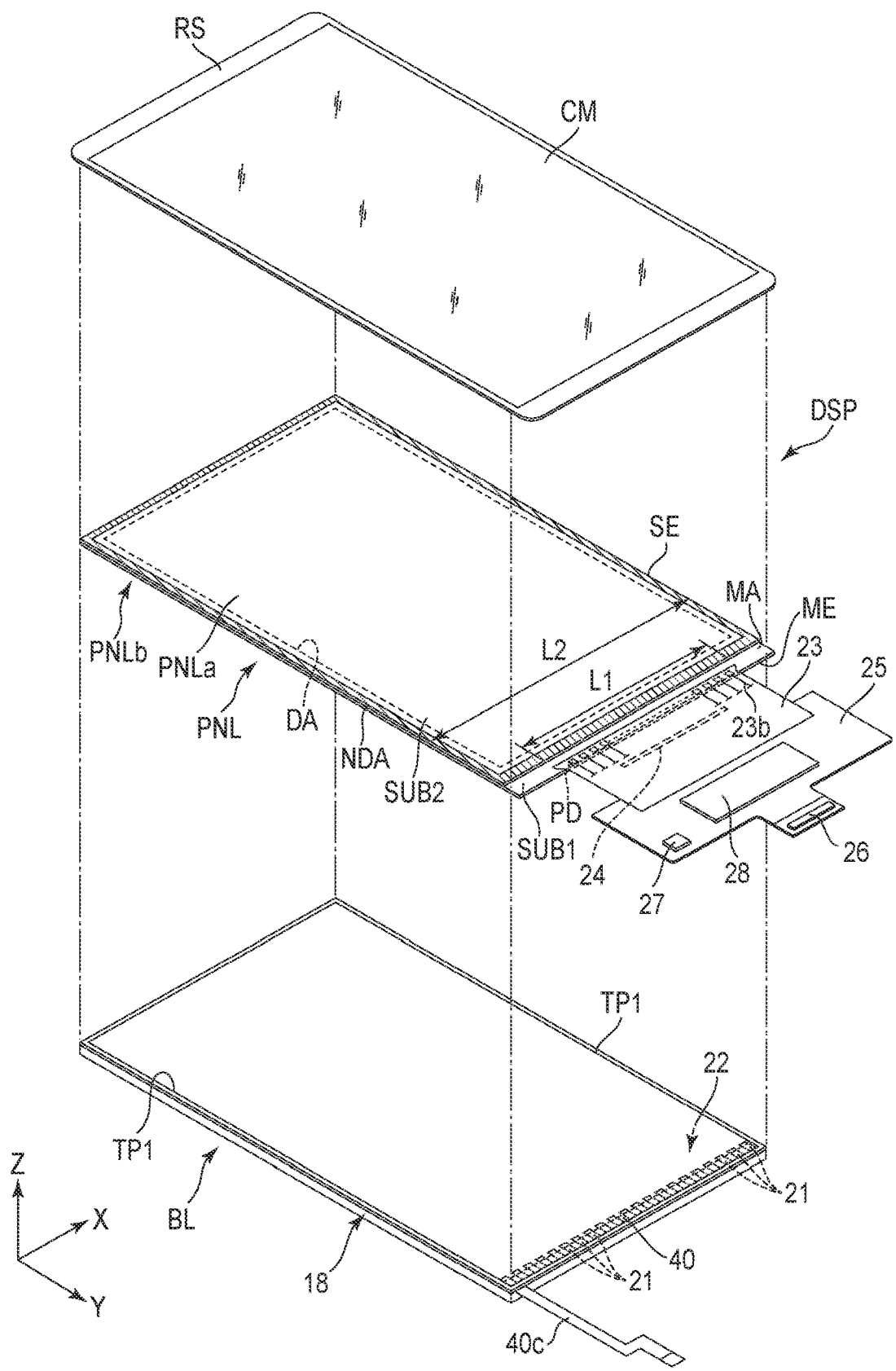
FIG. 1 is an exploded perspective view showing a display device according to an embodiment.

FIG. 1 is an exploded perspective view showing a display device DSP of this embodiment. The main configuration of the present embodiment can be used for electronic devices comprising a flexible printed circuit board, such as display devices. In this specification, the configuration of the present embodiment will be described by taking a display device as an example. The display device can be used for, for example, various devices such as a smartphone, a tablet terminal, a mobile telephone terminal, a notebook-type personal computer, a vehicle-mounted device, and a game console. This embodiment can be applied to various types of display devices including a self-luminous display device such as an organic electroluminescent display device, a micro-LED display device, an electronic paper display device comprising an electrophoretic element and the like, a display device in which micro-electromechanical systems (MEMS) are applied, and a display device in which an electrochromism is applied. Further, the application of the embodiment is not limited to the display devices mentioned above, but examples of the electronic device are a touch panel substrate and a fingerprint sensor substrate. The electronic devices comprise a panel, and a plurality of terminals on which flexible printed circuit boards of this embodiment are implemented are disposed on the panel.

A first direction X, a second direction and a third direction Z illustrated in the figures are orthogonal to each other but may intersect at an angle other than ninety degrees. The first direction X and the second direction Y correspond to a direction parallel to the main surface of the substrate which constitutes the display device DSP, and the third direction Z corresponds to a thickness direction of the display device DSP. In the present specification, a direction forwarding a tip of an arrow, which indicates the third direction Z, is called upward and a direction forwarding oppositely from the tip of the arrow is called downward. Such expression as "a second member on/above a first member" and "a second member under/below a first member", the second member may be in contact with the first member or may be separated from the first member. A view of an X-Y plane defined by the first direction X and the second direction Y, taken from a tip end side of the arrow indicating the third direction Z is called a plan view.

The display device DSP comprises an active matrix display panel PNL, a cover member CM overlaid on an upper surface PNLa of the display panel PNL, so as to cover the upper surface PNLa, a backlight unit BL disposed to oppose a lower surface PNLb of the display panel PNL so as to illuminate the display panel PNL, a flexible printed circuit board 23 and a circuit board 25.

The display panel PNL comprises a rectangular plate-shaped first substrate SUB1, and a rectangular plate-shaped second substrate SUB2 opposing the first substrate SUB1. The first substrate SUB1 and the second substrate SUB2 are attached to each other via a sealing member SE. In FIG. 1, the sealing member SE is located in a region indicated by hatching. The first substrate SUB1 and the second substrate SUB2 are each formed from a transparent insulating substrate such as a glass or resin plate. Further, the first substrate SUB1 includes a mounting portion MA which does not overlap the second substrate SUB2. The display panel PNL includes a mounting edge ME extending along the first direction X. The display panel PNL comprises a plurality of pad portions PD arranged in line along the mounting edge ME.

The display panel PNL includes a display area DA which displays images, located on an inner side of the sealing member SE and a non-display area NDA surrounding the display area DA. The display panel PNL is provided with a transmissive display function which displays images by selectively transmitting light from the backlight unit BL to the display area DA. Note that the display panel PNL may not necessarily be provided with a backlight unit BL, but the display panel PNL of the embodiment may be a transmissive type with a transmissive display function which displays images by selectively transmitting light from a lower surface side of the first substrate SUB1, a reflective type with a reflective display function which displays images by selectively transmitting light from an upper surface side of the second substrate SUB2, or a transreflective type comprising both of the transmissive display function and the reflective display function.

Here, a detailed explanation of the configuration of the display panel PNL will be omitted, but the display panel PNL may comprise a structure provided for any of a display mode which utilizes a lateral electric field along the main surface of the substrate, a display mode utilizing a longitudinal electric field along a normal to the main surface of the substrate, a display mode utilizing an inclined electric field inclined to a slant direction to the main surface of the substrate, and a display mode utilizing the lateral electric field, longitudinal electric field and inclined electric field appropriately in any combination. Note that the main surface of the substrate is a surface parallel to the X-Y plane defined by the first direction X and the second direction Y.

The display device DSP comprises a flexible printed circuit board 23 mounted on the mounting portion MA of the display panel PNL. The flexible printed circuit board 23 overlaps the pad portions PD. A width L1 of one end portion of the flexible printed circuit board 23 is less than a width L2 of the first substrate SUB1. Further, the flexible printed circuit board 23 includes a plurality of wiring lines 23b arranged along the first direction X, and the wiring lines 23b are respectively connected to the pad portions PD. On the flexible printed circuit board 23, a driver IC chip 24 is mounted as a signal supply source to supply signals necessary to drive the display panel PNL. Moreover, as will be described below, a spacer 103 abutting against the backlight unit BL is disposed around the driver IC chip 24. A flexible circuit board 25 is jointed to an extending end of the flexible printed circuit board 23. On the circuit board 25, a capacitor 28, connectors 26 and 27, and the like are mounted.

The cover member CM is formed from, for example, a glass plate or an acrylic transparent resin, and has a rectangular plate shape. On a peripheral portion of the cover member CM, a frame-shaped light-shielding layer RS is formed.

The backlight unit BL comprises a case 18, a plurality of optical members (not shown) arranged in the case 18, a light source unit 22 which supplies light to enter the optical members, a frame-shaped double-faced tape TP1 and the like. The light source unit 22 comprises a plurality of light sources 21 arranged at regular intervals along the first direction X, and a wiring substrate 40 which extends along the first direction X to support the light source 21. The wiring substrate 40 includes a connecting end portion 40c integrally formed therewith.

Figure 2:
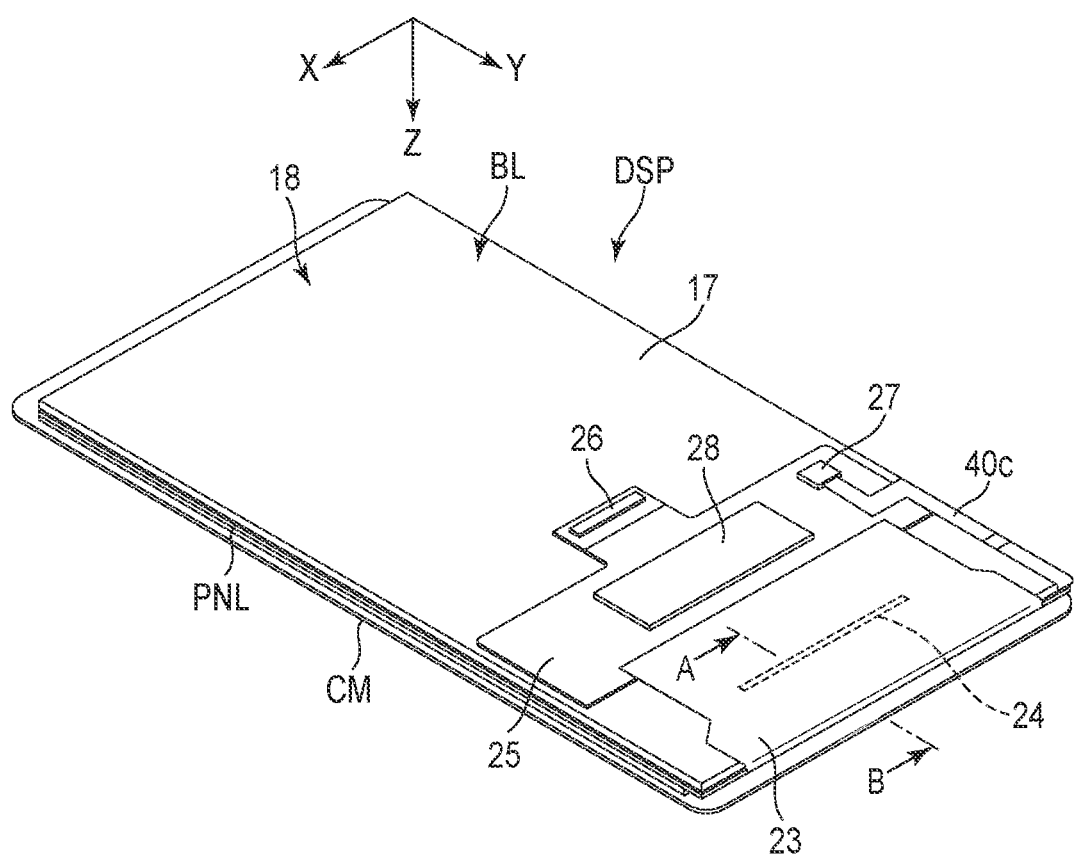
FIG. 2 is a perspective view of the display device shown in FIG. 1 as viewed from a rear surface side.

FIG. 2 is a perspective view of the display device DSP shown in the FIG. 1 as viewed from a rear surface side.

The flexible printed circuit board 23 is bent over to the rear surface side of the display panel PNL. In the example illustrated, the flexible printed circuit board 23 bent over opposes a bottom surface 17 of the backlight unit BL. Further, as in the case of the flexible printed circuit board 23, the connecting end portion 40c is also bent over to the rear surface side of the display panel PNL to oppose the bottom surface 17 of the backlight unit BL. The connecting end portion 40c is connected to the connector 27.

FIG. 3 is a cross-sectional view of the display device DSP taken along line A-B shown in FIG. 2.

The display panel PNL comprises a liquid crystal layer LC in an inner side surrounded by the first substrate SUB1, the second substrate SUB2 and the sealing member SE. Further, the display panel PNL comprises a first polarizer PL1 and a second polarizer PL2. The first polarizer PL1 is adhered to a lower surface of the first substrate SUB1. The second polarizer PL2 is adhered to a upper surface of the second substrate SUB2.

The cover member CM is adhered to the display panel PNL with an adhesive AD. The light-shielding layer RS is located on an lower surface of the cover member CM so as to be in contact with the adhesive AD. The light-shielding layer RS is located in the non-display area NDA. Note that the light-shielding layer RS may be formed on the upper surface of the cover member CM.

An anisotropic conductive film 3 adheres the display panel PNL and the flexible printed circuit board 23 together and electrically connects them to each other. In other words, the anisotropic conductive film 3 is interposed between the flexible printed circuit board 23 and the mounting portion of the first substrate SUB1. While the anisotropic conductive film 3 being interposed between the flexible printed circuit board 23 and the display panel PNL, the flexible printed circuit board 23 and the display panel PNL are pressed from above and below along the third direction Z, followed by heating, thus connecting them electrically and physically to each other.

Figure 4:
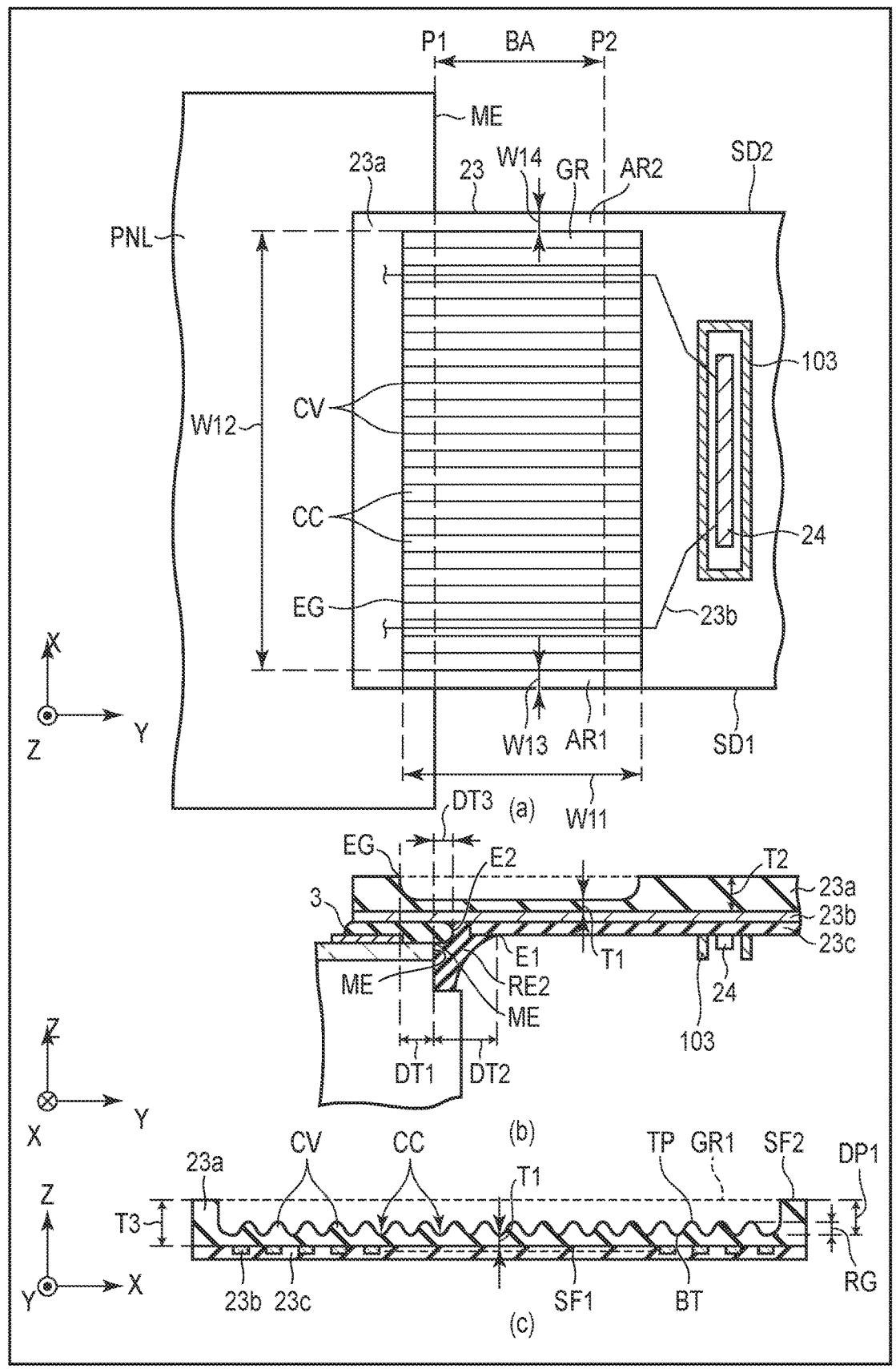
FIG. 4 is a view of a flexible printed circuit board shown in the FIG. 3.

The flexible printed circuit board 23 includes a base member 23a, wiring lines 23b and a protective layer 23c covering the wiring lines 23b. The base member 23a comprises a first surface SF1 and a second surface SF2 on an opposite side to the first surface SF1. The wiring lines 23b are located on a first surface SF1 side of the base member 23a. The base member 23a and the protective layer 23c are formed of, for example, a synthetic resin such as of polyimide or polyurethane. The wiring lines 23b are formed from, for example, a copper foil. The driver IC chip 24 is mounted on a protective layer 23c side and is electrically connected to the wiring lines 23b via openings (not shown) or contact pads provided in the protective layer 23c. Further, the flexible printed circuit board 23 is fixed to the bottom surface 17 of the backlight unit BL by a double-faced tape TP2. Further, the flexible printed circuit board 23 includes the spacer 103, by which structure, the driver IC chip 24 does not abut directly the backlight unit BL. As shown in FIG. 4, part (a), the spacer 103 surrounds the driver IC chip 24.

The flexible printed circuit board 23 includes a bend portion BA which can be bent. The flexible printed circuit board 23 is bent so that the protective layer 23c opposes the display panel PNL and the backlight unit BL. That is, the protective layer 23c is located in an inner peripheral side of the bend area BA, and the base member 23a is located in an outer circumferential side of the bend area BA. The flexible printed circuit board 23 contains, in the bend portion BA, a bend start point P1 on a display panel PNL side and a bend end point P2 on a side distant from the display panel PNL with respect to the bend start point P1. The bend area BA corresponds to a region between the bend start point P1 and the bend end point P2. That is, the flexible printed circuit board 23 has a curvature between the bend start point P1 and the bend end point P2. In the example illustrated, the bend start point P1 overlaps the mounting edge ME along the third direction Z.

The base member 23a comprises a groove GR located in the bend portion BA and formed in a second surface SF2. One groove GR overlaps the bend start point P1 and the bend end point P2. That is, the groove GR overlaps the mounting edge ME along the third direction Z. As illustrated in the figure, the groove GR may be formed to the outside of the bend area BA. The groove GR extends out to a display area DA side further from the bend start point P1 to overlap the first substrate SUB1 along the third direction Z. Further, the groove GR does not penetrate the base member 23a. As will be described below with reference to FIG. 4, the groove GR is formed to comprise an irregular bottom surface with convex portions CV.

A protection resin RE1 is formed between the second substrate SUB2 and the flexible printed circuit board 23. The protection resin RE1 covers the anisotropic conductive film 3, the pad portions PD and the wiring lines and the like on the first substrate SUB1. A protection resin RE2 is formed on a protective layer 23c side of the flexible printed circuit board 23. The protection resin RE2 is in contact with the display panel PNL, the anisotropic conductive film 3 and the protective layer 23c.

FIG. 4 is a diagram showing the flexible printed circuit board 23 shown in FIG. 3. FIG. 4, part (a) shows a developed plan view of the flexible printed circuit board 23, and FIG. 4, part (b) shows a developed cross sectional view of the flexible printed circuit board 23 taken along the second direction Y, and FIG. 4, part (c) shows a developed cross sectional view of the flexible printed circuit board 23 taken along the first direction X.

As shown in FIG. 4, part (a), the bend start point P1 and the bend end point P2 extend along the first direction X. The driver IC chip 24 extends along the first direction X. The groove GR includes a plurality of concavity portions CC. The concavity portions CC extend along the second direction Y and arranged along the first direction X. Further, the groove GR includes a plurality of convex portions CV. The convex portions CV extend along the second direction Y and arranged along the first direction X. Each convex portion CV is located between each respective adjacent pair of concavity portions CC. These the concavity portions CC and the convex portions CV are formed by making the groove GR along the second direction Y while forming the groove GR with laser. In this embodiment, the groove GR has a width (a first width) W11 along the second direction Y. The width W11 is 0.05 to 5 mm. The width W11 should preferably be, particularly, 1.0 to 3.5 mm, and 2.5 mm is recommended. Further, the groove GR has a width (a second width) W12 along the first direction X. The width W12 is 5 to 60 mm.

The flexible printed circuit board 23 comprises a first side SD1 and a second side SD2 extending along the second direction Y. In the example illustrated, the first side SD1 and the second side SD2 extend substantially parallel to each other, but one or both may be inclined to the second direction Y. The base member 23a includes a first frame area AR1 between the first side SD1 and the respective groove GR and a second frame area AR2 between the second side SD2 and the respective groove GR. The groove GR is located between the first frame area AR1 and the second frame area AR2. That is, the groove GR does not overlap the first frame area AR1 and the second frame area AR2, or do not extend to the first side SD1 and the second side SD2. Note that the groove GR may extend to the first side SD1 and the second side SD2. The groove GR overlaps the mounting edge ME of the display panel PNL. The first frame area AR1 has a width (a third width) W13 along the first direction X. The second frame area AR2 has a width (a fourth width) W14 along the first direction X. The widths W13 and W14 each are 0.2 to 5 mm. The widths W13 and W14 should preferably be 0.2 to 1.0 mm. The widths W13 and W14 may be equal to or different from each other. The wiring lines 23b should preferably not overlap the first frame area AR1 and the second frame area AR2.

As shown in FIG. 4, part (b), the base member 23a has a thickness T1 in a site where a groove GR is formed, and a thickness T2 in a site overlapping the driver IC chip 24. In this example, the thickness T2 is 35 µm. The thickness T1 is less than the thickness T2. The groove GR comprises an edge portion (a first edge portion) EG which extends along the first direction X and overlaps the display panel PNL. A distance (a first distance) DT1 taken along the second direction Y between the edge portion EG and the mounting edge ME is 0 to 1.0 mm. The distance DT1 should preferably be, particularly, 0.025 to 0.3 mm, and 0.175 mm is recommended. The protection resin RE2 includes an end portion E1 on an opposite side to the display panel PNL. A distance (a second distance) DT2 taken along the second direction Y between the end portion E1 and the mounting edge ME is 0 to 1.5 mm. The distance DT2 should preferably be, particularly, 0.3 to 1.0 mm. Further, the anisotropic conductive film 3 includes an end portion E2 in contact with the protection resin RE2. A distance DT3 taken along the second direction Y between the end portion E2 and the mounting edge ME is 0 to 0.3 mm. The distance DT3 should preferably be, particularly, 0 to 0.15 mm.

As shown in FIG. 4, part (c), the concavity portions CC and the convex portions CV are formed in the bottom surface of each groove GR, that is, the surface of a first surface SF1 side of the base member 23a. A depth DP1 taken between the second surface SF2 and the deepest portion of the concavity portions CC is 0.5 to 32 µm. The depth DP1 should preferably be, particularly, 5 to 25 µm. Further, a range RG defined between a top portion TP of the convex portions CV and a deepest portion BT of the concavity portions CC is 0.5 to 32 µm. The range RG should preferably be, particularly, 5 to 25 µm. The base member 23a has a thickness T1 in a site where each groove GR is formed and a thickness T3 in a site overlapping the first frame area AR1 and the second frame area AR2. The thickness T1 is less than the thickness T3.

Here, an effect of this embodiment will be described.

The driver IC chip 24 is mounted on the flexible printed circuit board 23. With this structure, as compared to the case where the driver IC chip 24 is not mounted, the thickness of the flexible printed circuit board 23 need to be increased to improve the strength of the substrate, in which case the repulsion against the bending may increase. Further, in order to narrow the frame of the display device DSP, the bending curvature of the bend portion BA tends to increase, and steeper bending is required. Therefore, the repulsion against the bending of the flexible printed circuit board 23 may further increase. On the other hand, with the narrowed frame, an adhesion area between the display panel PNL and the backlight unit BL is decreased, and therefore the adhesivity between the display panel PNL and the backlight unit BL is lowered. In other words, by narrowing the frame, as the repulsion of the flexible printed circuit board 23 increases, the adhesivity decreases in reverse, which may cause separation of the junction between the backlight unit BL and the display panel PNL, separation or deformation of parts in the backlight unit BL and the like.

According to this embodiment, the flexible printed circuit board 23 comprises a groove GR formed in the base member 23a. With this structure, the flexible printed circuit board 23 can be form to include a thin film portion, which can reduce the rigidity of the flexible printed circuit board 23. Thus, the flexible printed circuit board 23 can be bent easily, and the repulsion of the flexible printed circuit board 23, which occurs by banding can be decreased. Therefore, the separation of the junction between backlight unit BL and the display panel PNL due to the repulsion of the flexible printed circuit board 23, separation of the double-faced tape TP2, separation and deformation of the internal parts of the backlight unit BL and the like can be suppressed. Further, in the case of a display device DSP which does not require a backlight unit BL, separation of the flexible printed circuit board 23 and separation and deformation of members to which the flexible printed circuit board 23 is joined, and the like can be suppressed. Further, the parts conventionally required to adhere the flexible printed circuit board 23 against repulsion can be cut down, which can make it possible to reduce the production cost and reduce of the number of processing steps in the assembling.

Further, as the repulsion to the bending of the flexible printed circuit board 23 is reduced, the flexible printed circuit board 23 can be bent further steeper, thereby making it possible to reduce the outward swelling of the flexible printed circuit board 23. Thus, the frame of the display device DSP can be narrowed.

Meanwhile, the groove GR of the embodiment is constructed by a plurality of concavity portions CC formed along the second direction Y. The bend area BA is bent along second direction Y. That is, the concavity portions CC are parallel to the bending direction, or perpendicular to the mounting edge ME. The bending direction is defined as a direction indicated by an arrow shown in the bend area BA of FIG. 3, for example. With this structure, the concentration of stress on the bend area BA is dispersed as compared to the case where the concavity portions CC are formed along the first direction X with laser, thus making it possible to reduce the risk of disconnection of the wiring lines 23b.

Further, in the example illustrated, the groove GR overlaps the bend start point P1 and the bend end point P2. In the bend start point P1 and the bend end point P2, it is easy for particularly great shearing stress to occur under the influence of bending stress. However, with the groove GR thus formed, the thickness in the bend start point P1 and the bend end point P2 of the flexible printed circuit board 23 is less, and therefore the shearing stress can be relaxed. As described, in the points where stress is particularly great, breakage of the flexible printed circuit board 23 and disconnection of the wiring lines 23b can be suppressed as well.

Further, in this embodiment, the base member 23a includes the first frame area AR1 and the second frame area AR2, and the groove GR does not overlap the first frame area AR1 and the second frame area AR2. That is, the groove GR does not extend to the first side SD1 and the second side SD2 of the flexible printed circuit board 23. With this structure, a thinned portion is not formed in the first side SD1 and the second side SD2, which can suppress the flexible printed circuit board 23 from breaking from the first side SD1 or the second side SD2.

Next, the second embodiment will be described with reference to FIGS. 5 and 6.

FIG. 5 is a cross section of a display device DSP according to the second embodiment. The configuration shown in FIG. 5 is different from that of FIG. 3 in that the base member 23a comprises the first groove GR1 and the second groove GR2.

In the example illustrated, the groove GR is constructed by a first groove GR1 and a second groove GR2. The first groove GR1 is located in the bend start point P1. The second groove GR2 is located in the bend end point P2. That is, the first groove GR1 overlaps the mounting edge ME along the third direction Z. As illustrated in the figure, the first groove GR1 and the second groove GR2 may be formed over to an outside of the bend area BA. The first groove GR1 extends on an display area DA side further from the bend start point P1, and overlaps the first substrate SUB1 along the third direction Z. Further, the first groove GR1 and the second groove GR2 do not penetrate the base member 23a. As will be described below with reference to FIG. 6, the first groove GR1 and the second groove GR2 are formed to comprise an irregular bottom surface with convex portions CV.

Figure 6:
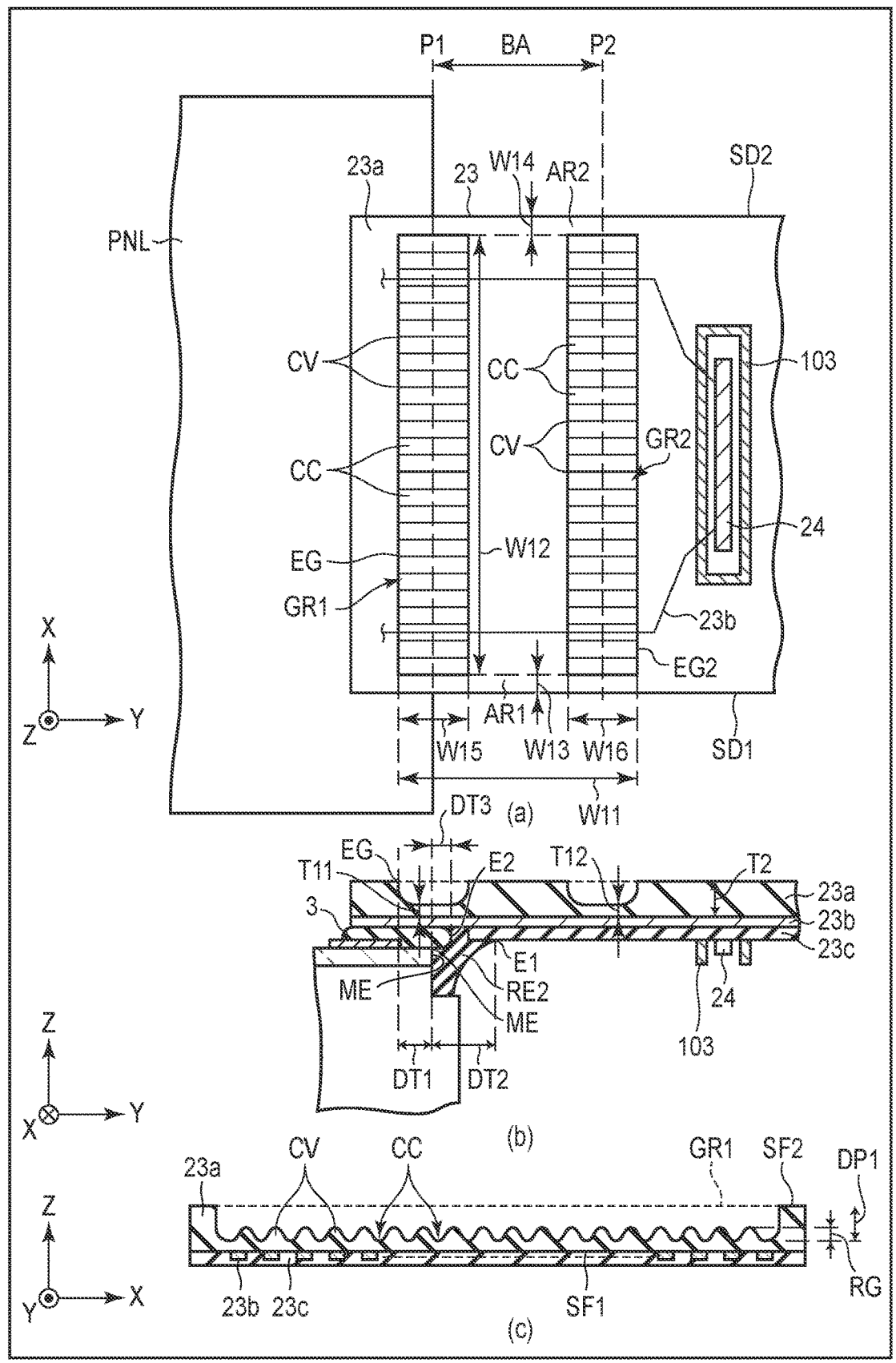
FIG. 6 is a view showing a flexible printed circuit board shown in FIG. 5.

FIG. 6 is a view of the flexible printed circuit board 23 shown in FIG. 5. FIG. 6, part (a) shows a developed plan view of the flexible printed circuit board 23. FIG. 6, part (b) is a developed cross-sectional view of the flexible printed circuit board 23 taken along the second direction Y. FIG. 6, part (c) is a developed cross-sectional view of the flexible printed circuit board 23 taken along the first direction X.

As shown in FIG. 6, part (a), the first groove GR1 overlaps the bend start point P1 and extends along the first direction X. The second groove GR2 overlaps the bend end point P2 and extends along the first direction X. The first groove GR1 and the second groove GR2 each comprise a plurality of concavity portions CC. The concavity portions CC extend along the second direction Y and are arranged along the first direction X. A plurality of the convex portions CV are each formed between each respective adjacent pair of concavity portions CC. The concavity portions CC and the convex portions CV are formed by making the first groove GR1 and the second groove GR2 when forming the first groove GR1 and the second groove GR2 along the second direction Y with laser. In the second embodiment, the first groove GR1 has a width (a fifth width) W15 along the second direction Y. The width W15 is 0.05 to 2.5 mm. The width W15 should preferably be, particularly, 0.05 to 1.25 mm. The second groove GR2 has a width (a sixth width) W16 along the second direction Y. The width W16 is 0.05 to 2.5 mm. The width W16 should preferably be, particularly, 0.05 to 1.25 mm. The first groove GR1 includes an edge portion EG1 which extends along the first direction X and overlaps the display panel PNL. The second groove GR2 includes an edge portion EG2 which extends along the first direction X and is located on a driver IC chip 24 side. The width W11 between the edge portion EG1 and the edge portion EG2 is equal to the width W11 of the groove GR taken along the second direction Y, discussed in the first embodiment.

The first groove GR1 and the second groove GR2 are located between the first frame area AR1 and the second frame area AR2. That is, the first groove GR1 and the second groove GR2 do not overlap the first frame area AR1 and the second frame area AR2, and do not extend over to the first side SD1 and the second side SD2. The width W13 of the first frame area AR1 and the width W14 of the second frame area AR2 are respectively equal to the widths W13 and W14 discussed in the first embodiment.

As shown in FIG. 6, part (b), the base member 23a has a thickness T11 in a site where the first groove GR1 is formed, and has a thickness T12 in a site where the second groove GR2 is formed. Further, it has a thickness T2 in a site overlapping the driver IC chip 24. The thicknesses T11 and T12 are each thinner than the thickness T2. The thicknesses T11 and T12 may be equal to or different from each other. A distance DT1 between the edge portion EG1 and the mounting edge ME taken along the second direction Y is equal to the distance DT1 discussed in the first embodiment. A distance DT2 between the end portion E1 of the protection resin RE2 and the mounting edge ME taken along the second direction Y is equal to the distance DT2 discussed in the first embodiment. A distance DT3 between the end portion E2 of the anisotropic conductive film 3 and the mounting edge ME taken along the second direction Y is equal to the distance DT3 discussed in the first embodiment.

As shown in FIG. 6, part (c), the concavity portions CC and the convex portions CV are formed in the bottom surface of the first groove GR1, that is, a surface on a first surface SF1 side of the base member 23a. A depth DP1 between the second surface SF2 and the deepest portion of the concavity portions CC is equal to the depth DP1 discussed in the first embodiment. Further, a range RG between the deepest portion of the concavity portions CC and a top portion of the convex portions CV is equal to the range RG discussed in the first embodiment. The second groove GR2 is similar to the first groove GR1.

For this reason, advantages similar to those of the first embodiment can be obtained in the second embodiment.

The third embodiment will be described with reference to FIGS. 7 and 8.

FIG. 7 is a cross section of a display device DSP according to the third embodiment. The configuration shown in FIG. 7 is different from that of FIG. 5 in that the base member 23a comprises a first groove GR1, but does not comprise a second groove GR2. The configuration of the first groove GR1 shown in FIG. 7 is similar to the configuration of the first groove GR1 shown in FIG. 5.

Figure 8:
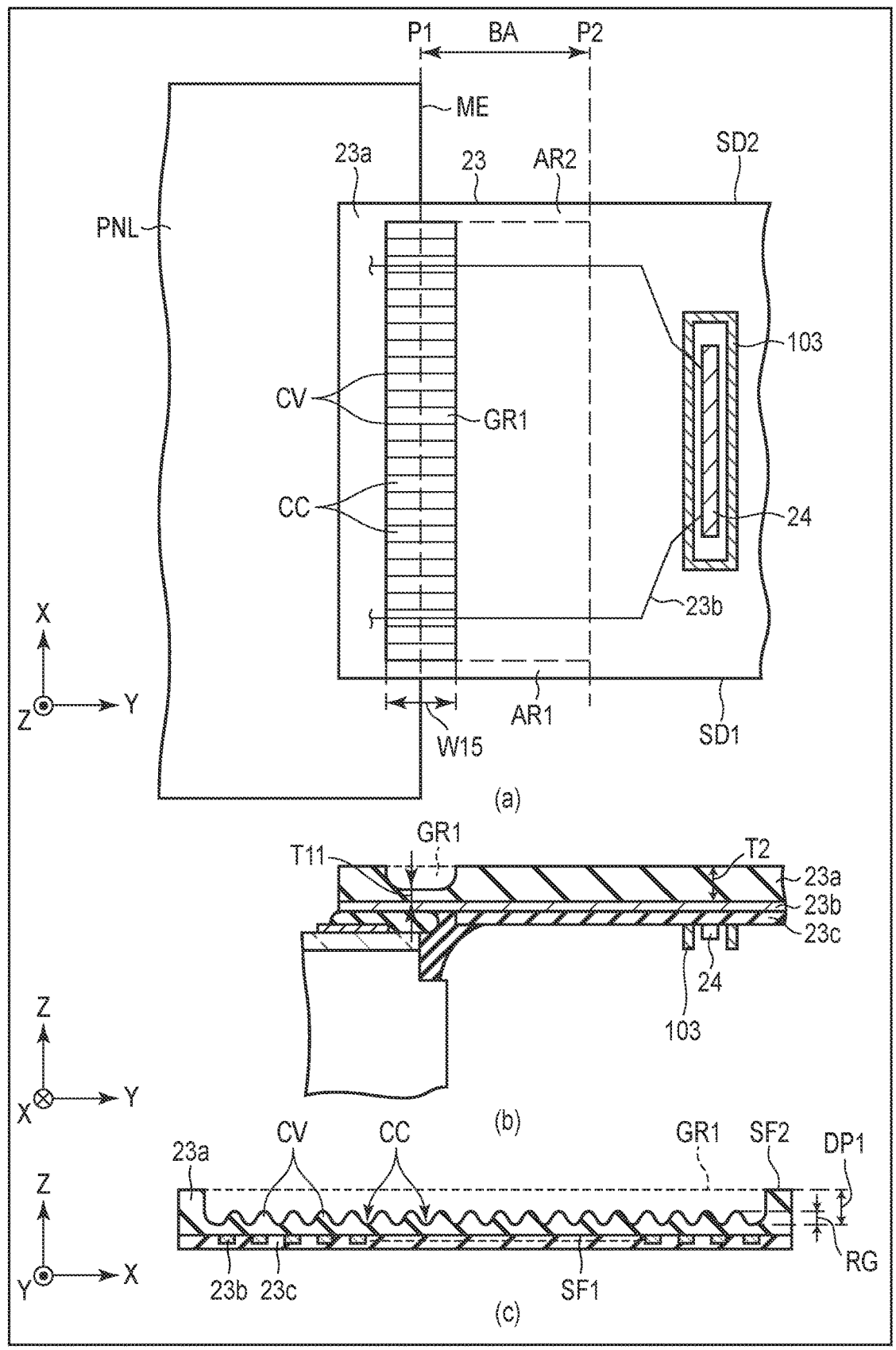
FIG. 8 is a view showing a flexible printed circuit board shown in FIG. 7.

FIG. 8 is a diagram illustrating the flexible printed circuit board 23 shown in FIG. V. FIG. 8, part (a) is a developed plan view of the flexible printed circuit board 23, and FIG. 8, part (b) is a developed cross-sectional view of the flexible printed circuit board 23 taken along the second direction Y. FIG. 8, part (c) is a developed cross-sectional view of the flexible printed circuit board 23 taken along the first direction X. The configuration of a first groove GR1 shown in FIG. 8 is equal to the configuration of the first groove GR1 shown in FIG. 6. The width W15 of the first groove GR1 is 0.05 to 5 mm. The width W15 should preferably be, particularly, 0.05 to 1.25 mm. The bend start point P1 is a site where the repulsion is at maximum in the bend area BA, and therefore, by setting the first groove GR1 in the bend start point P1, the repulsion of the flexible printed circuit board 23 can be effectively relaxed.

Thus, advantages similar to those of the first embodiment can also be obtained in the third embodiment.

Next, the fourth embodiment will be described with reference to FIGS. 9 and 10.

Figure 9:
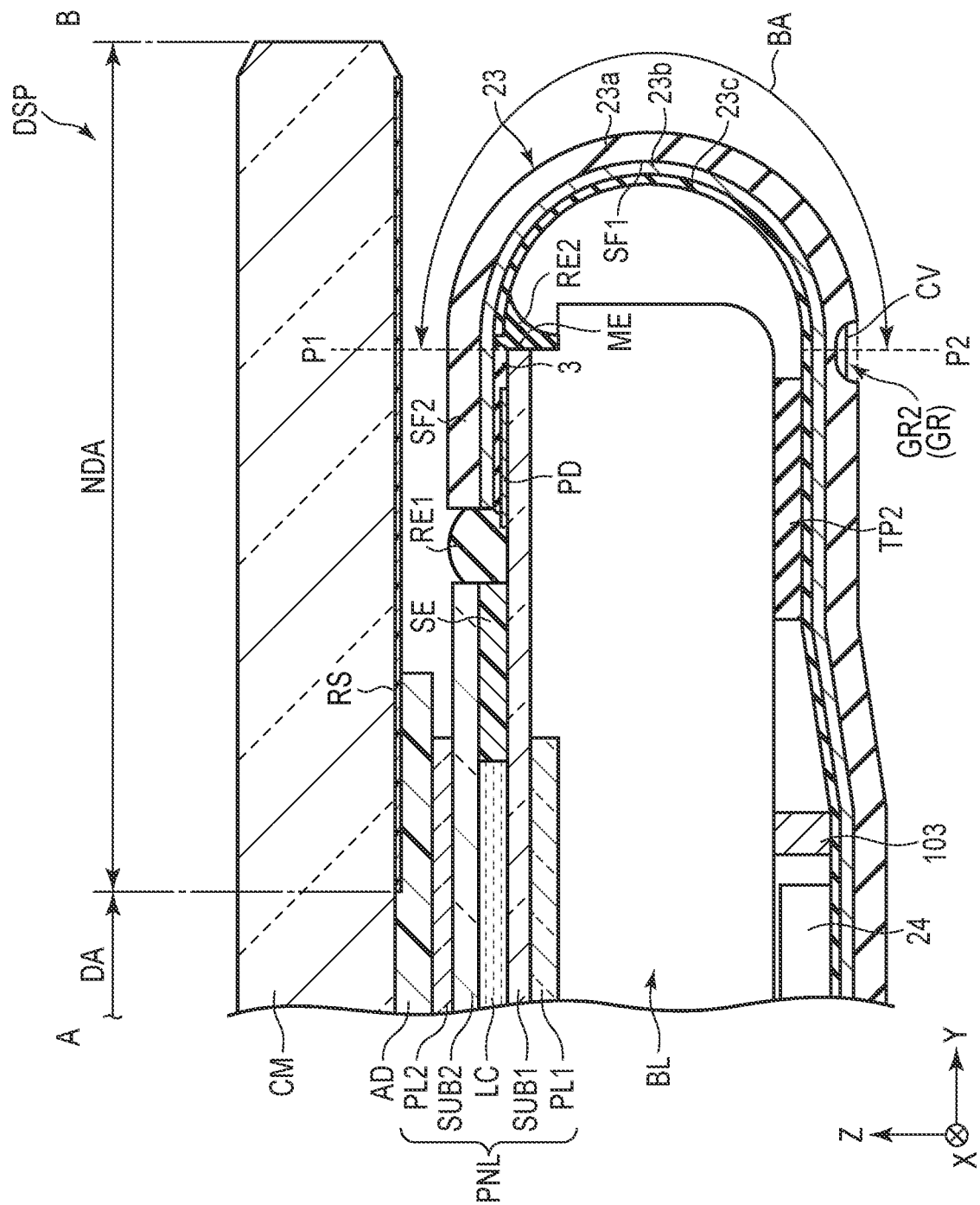
FIG. 9 is a cross-sectional view of a display device according to the fourth embodiment.

FIG. 9 is a cross section of a display device DSP according to the fourth embodiment. The configuration shown in FIG. 9 is different from that of FIG. 5 in that the base member 23a comprises a second groove GR2, but does not comprise a first groove GR1. The configuration of the second groove GR2 shown in FIG. 9 is similar to the configuration of the second groove GR2 shown in FIG. 5.

Figure 10:
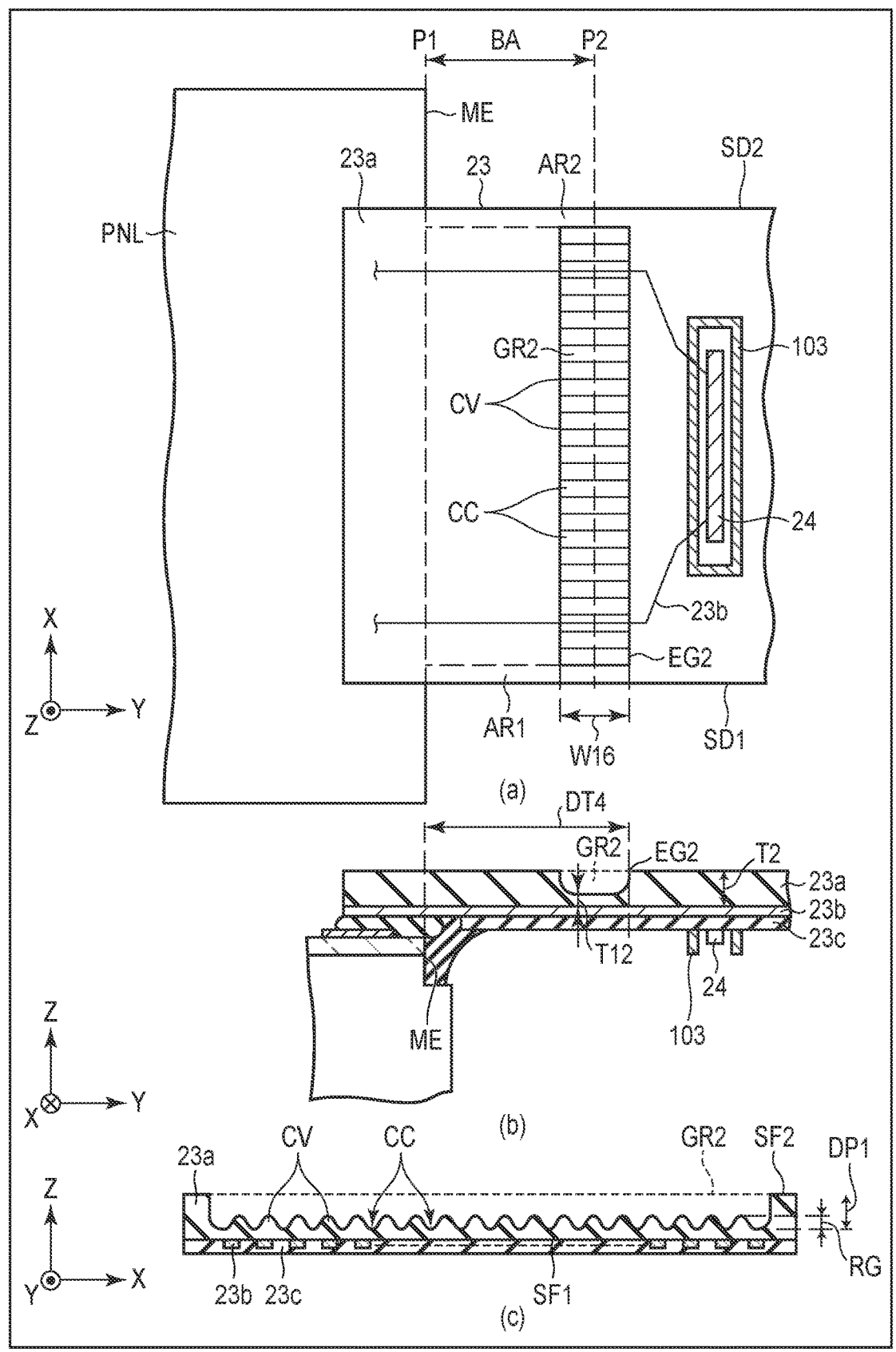
FIG. 10 is a view showing a flexible printed circuit board shown in FIG. 9.

FIG. 10 is a diagram illustrating the flexible printed circuit board 23 shown in FIG. 9. FIG. 10, part (a) is a developed plan view of the flexible printed circuit board 23, and FIG. 10, part (b) is a developed cross-sectional view of the flexible printed circuit board 23 taken along the second direction Y. FIG. 10, part (c) is a developed cross-sectional view of the flexible printed circuit board 23 taken along the first direction X. The configuration of a second groove GR2 shown in FIG. 10 is equal to the configuration of the second groove GR2 shown in FIG. 6. The width W16 of the second groove GR2 is 0.05 to 5 mm. The width W16 should preferably be, particularly, 0.05 to 1.25 mm. The width W16 should preferably be, particularly, 0.05 to 1.25 mm. Further, a distance DT4 between the edge portion EG2 of the second groove GR2 and the mounting edge ME taken along the second direction Y is 0.05 to 5 mm. A distance DT should preferably be, particularly, 0.75 to 3.75 mm. Here, the bend end point P2 is located at a site most close to the double-faced tape TP2 in the bend area BA, and therefore, by setting the second groove GR2 in the bend end point P2, the release force to occur to an adhesion portion between the backlight unit BL and the flexible printed circuit board 23 can be effectively reduced.

For this reason, advantages similar to those of the first embodiment can also be obtained in the fourth embodiment.

FIG. 11 is a diagram showing the first example of a processing step of forming grooves GR in the flexible printed circuit board 23.

A motherboard 100 to prepare a plurality of flexible printed circuit boards 23 is rolled round a reel. Flexible printed circuit boards 23 are cut out from one motherboard 100 with a punch die. The motherboard 100 includes a base member 23a, wiring lines 23b and a protective layer 23c as those shown in FIG. 3. A test pad TPD for testing electrical continuity of a flexible printed circuit board 23 is placed outside of the flexible printed circuit board 23. A plurality of wiring lines 23b are drawn to the outside of the flexible printed circuit board 23 and connected to the test pads TPD.

In the example illustrated in FIG. 11, before flexible printed circuit boards 23 are cut out from the motherboard 100, laser LL is irradiated onto a flexible printed circuit board 23 to form a groove GR. The groove GR is formed between the first frame area AR1 and the second frame area AR2 in the bend area BA. The reel may be set in a mounting machine to perform a process to mount a flexible printed circuit board 23 on a display panel PNL, and the step of punching flexible printed circuit boards 23 out from the motherboard 100 may be performed in the mounting machine.

Figure 12:
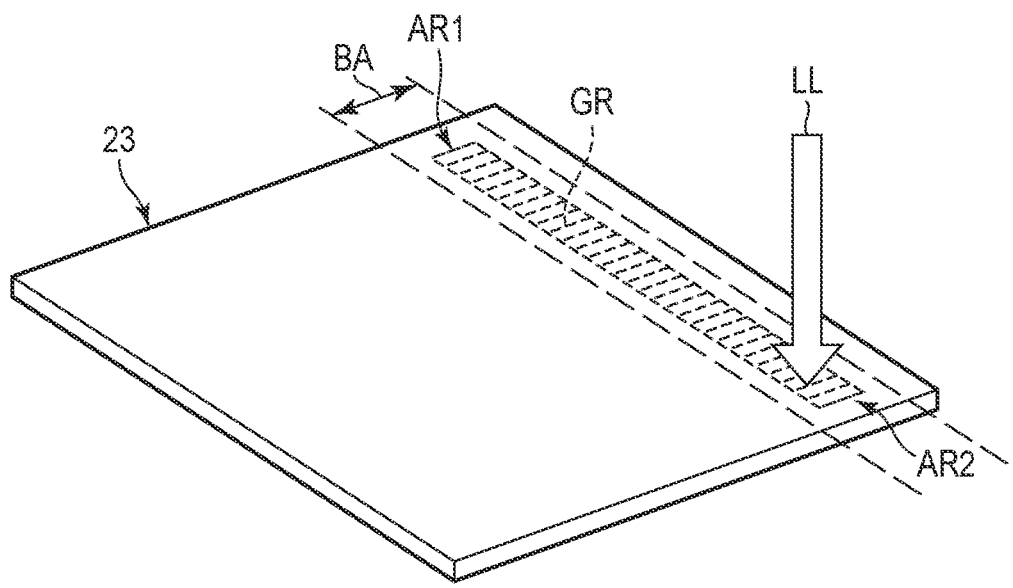
FIG. 12 is a diagram showing the second example of the process of forming grooves in a flexible printed circuit board.

FIG. 12 is a diagram showing the second embodiment of the processing step of forming a groove GR in a flexible printed circuit board 23.

In the example illustrated in FIG. 12, laser LL is irradiated onto a single-unit flexible printed circuit board 23 to form the groove GR. More specifically, after a flexible printed circuit board 23 is cut out from a motherboard 100 such as shown in FIG. 11 or immediately before the flexible printed circuit board 23 is mounted to the display panel PNL, the groove GR is formed. The groove GR is formed between the first frame area AR1 and the second frame area AR2 in the bend area BA.

Figure 13:
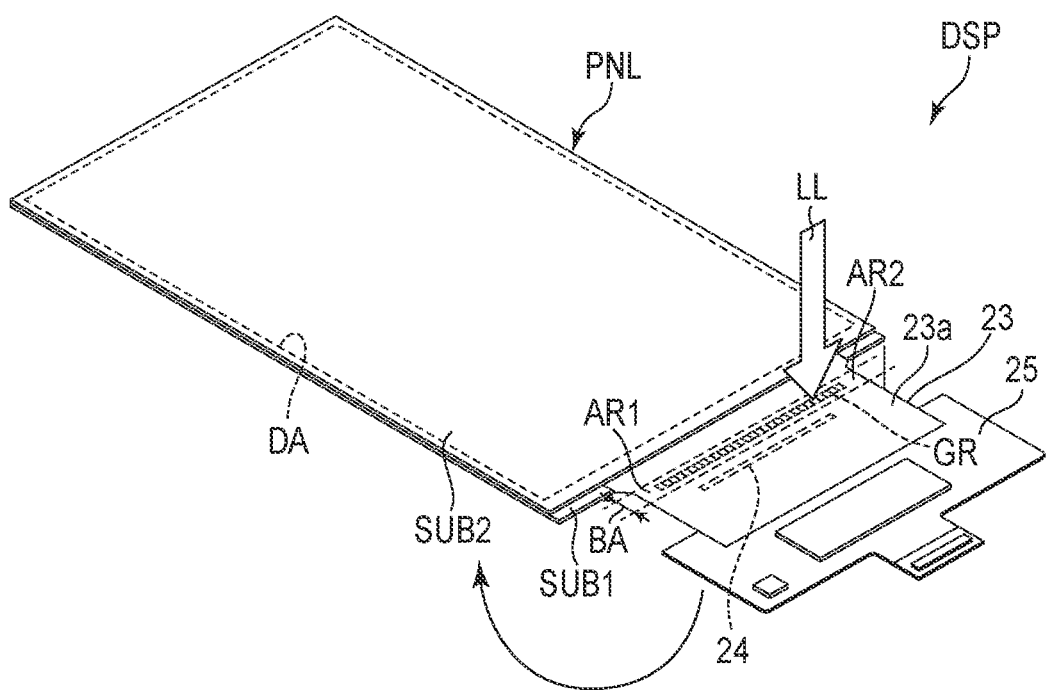
FIG. 13 is a diagram showing the second example of the process of forming grooves in a flexible printed circuit board.

FIG. 13 is a diagram showing the third embodiment of the processing step of forming a groove GR in a flexible printed circuit board 23.

In the example illustrated in FIG. 13, after mounting the flexible printed circuit board 23 in the display panel PNL, laser LL is irradiated on the base member 23a to form the groove GR. The groove GR is formed between the first frame area AR1 and the second frame area AR2 in the bend area BA. After forming the groove GR, the flexible printed circuit board 23 is bent from the bend portion BA.

Figure 14:
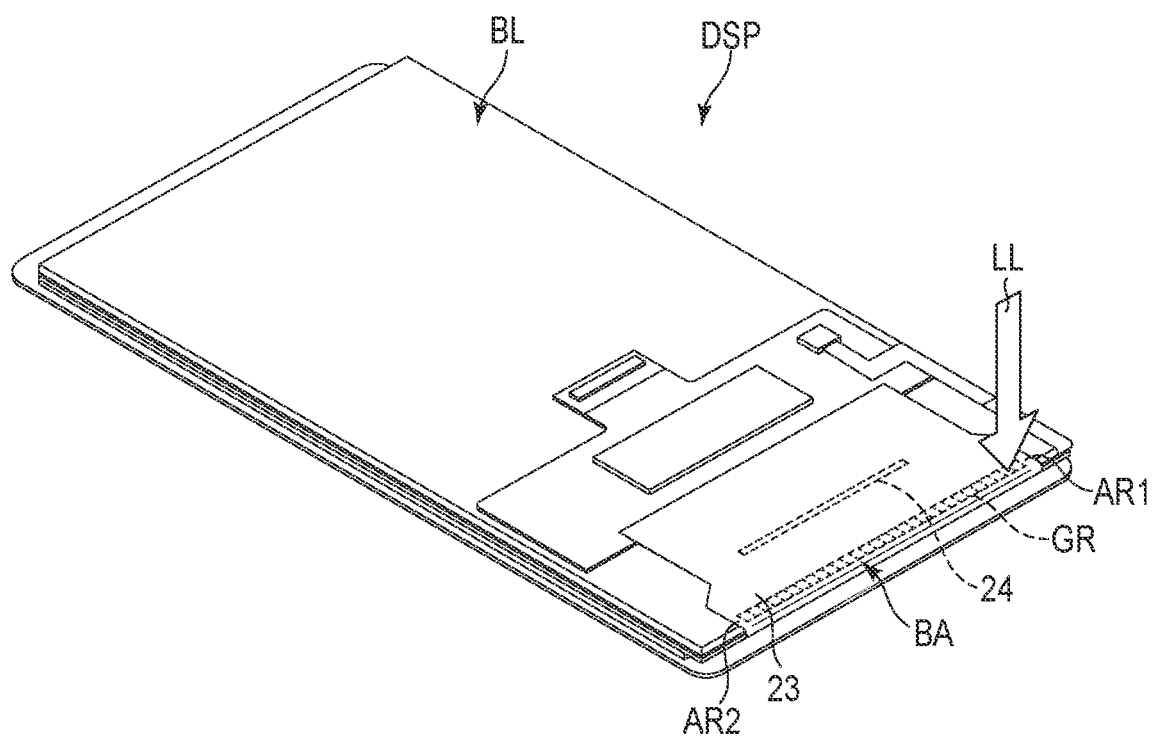
FIG. 14 is a diagram showing the second example of the process of forming grooves in a flexible printed circuit board.

FIG. 14 is a diagram showing the fourth embodiment of the processing step of forming a groove GR in a flexible printed circuit board 23.

In the example illustrated in FIG. 14, after the flexible printed circuit board 23 is bent, the groove GR is formed in the flexible printed circuit board 23 by laser LL. Or, at the end of the manufacturing process of the display device DSP, the groove GR is formed in the flexible printed circuit board 23 by laser LL. The groove GR is formed between the first frame area AR1 and the second frame area AR2 in the bend area BA.

The processing step of forming a groove GR by the laser LL, described above, may be performed by a single-unit laser mechanism, or it may be performed in a mounting machine configured to mount a flexible printed circuit board 23 in a display panel PNL. The laser mechanism can be installed in an arbitrary site in the device of manufacturing display devices DSP. The processing steps shown in FIGS. 11 to 14 can be applied to all the patterns of the grooves GR described above.

As discussed above, according to this embodiment, an electronic device and a flexible printed circuit board, with improved reliability can be obtained.

Note that, in the examples described above, the driver IC chip 24 is mounted on the flexible printed circuit board 23, but the driver IC chip 24 may be mounted on the display panel PNL. Or, if the strength of the flexible printed circuit board 23 is sufficient, the groove GR may be formed in the first frame area AR1 and the second frame area AR2 as well. Further, the pattern of the groove GR can be adjusted to an arbitrary shape and may as well be so other pattern than those discussed above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising: a panel comprising a mounting edge extending along a first direction and a plurality of pad portions arranged along the mounting edge; a flexible printed circuit board mounted on the panel and overlapping the plurality of pad portions; and a driver IC chip mounted on the flexible printed circuit board and configured as a signal supply source which supplies a signal necessary to drive the panel, wherein the flexible printed circuit board comprising a base member comprising a first surface and a second surface on an opposite side to the first surface, wiring lines placed on a side of the first surface of the base member and a protective layer covering the wiring lines, and including a bend portion which can be bent, the base member comprising a groove portion located in the bend portion and formed in the second surface, the groove portion comprising a plurality of concavity portions extending along a second direction intersecting the first direction and arranged along the first direction, and a thickness of the base member in a site where the groove portion is formed being less than a thickness of the base member in a site overlapping the driver IC chip.

2. The electronic device of claim 1, wherein
the flexible printed circuit board comprises a first side and a second side, extending along the second direction,
the base member includes a first frame area between the first side and the groove portion and a second frame area between the second side and the groove portion,
the groove portion is located between the first frame area and the second frame area, and
a thickness of the base member in a site where the groove is formed is less than a thickness of the base member in a site overlapping the first frame area and the second frame area.

3. The electronic device of claim 1, wherein
the flexible printed circuit board comprises a bend start point extending along the first direction on a display panel side of the bend portion, and
the groove portion comprises a first groove portion overlapping the bend start point and extending along the first direction.

4. The electronic device of claim 1, wherein
the flexible printed circuit board comprises a bend start point extending along the first direction on a display panel side of the bend portion, and a bend end point extending along the first direction on a side spaced further from the panel than the bend start point, and
the groove portion comprises a second groove portion overlapping the bend end point and extending along the first direction.

5. The electronic device of claim 1, wherein
the flexible printed circuit board comprises a bend start point extending along the first direction on a display panel side of the bend portion, and a bend end point extending along the first direction on a side spaced further from the panel than the bend start point, and
one of the groove portions overlaps the bend end point and the bend start point.

6. The electronic device of claim 5, wherein
the groove portion has a first width along the second direction, and
the first width is 0.05 to 5 mm.

7. The electronic device of claim 1, wherein
the groove portion includes a first edge portion extending along the first direction and overlapping the panel, and
a first distance between the first edge portion and the mounting edge along the second direction is 0 to 1.0 mm.

8. The electronic device of claim 1, further comprising:
an anisotropic conductive film adhering the panel and the flexible printed circuit board to each other; and
a protection resin in contact with the panel, the anisotropic conductive film and the protective layer,
wherein
a second distance between an edge portion on an opposite side to the panel in the protection resin and the mounting edge along the second direction is 0 to 1.5 mm.

9. The electronic device of claim 1, wherein
the groove portion has a second width along the first direction, and
the second width is 5 to 60 mm.

10. The electronic device of claim 2, wherein
the first frame area has a third width along the first direction,
the second frame area has a fourth width along the first direction, and
the third width and the fourth width each are 0.2 to 5 mm.

11. The electronic device of claim 3, wherein
the first groove portion has a fifth width along the second direction, and
the fifth width is 0.05 to 5 mm.

12. The electronic device of claim 4, wherein
the second groove portion has a sixth width along the second direction, and
the sixth width is 0.05 to 5 mm.

13. The electronic device of claim 1, wherein
in the groove portion, a depth between the second surface and a deepest portion of the concavity portions is 0.5 to 32 μm.

14. The electronic device of claim 1, wherein
the groove portion comprises a plurality of convex portions extending along a second direction intersecting the first direction and arranged along the first direction,
the plurality of convex portions are each located between each respective adjacent pair of concave portions, and
a range between the deepest portion of the plurality of concave portions and a top of the plurality of convex portions is 0.5 to 32 μm.

15. A flexible printed circuit board comprising:
a driver IC chip extending along a first direction;
a bend portion being bendable and comprising a base member including a first surface and a second surface on an opposite side to the first surface, wiring lines located on a side of the first surface of the base member and a protective layer covering the wiring lines,
the base member comprising a groove portion located in the bend portion and formed in the second surface,
the groove portion comprising a plurality of concavity portions extending along a second direction intersecting the first direction, and arranged along the first direction, and
a thickness of the base member in a site where the groove is formed being less than a thickness of the base member in a site overlapping the driver IC chip.

16. The flexible printed circuit board of claim 15, further comprising a first side and a second side, extending along the second direction,
wherein
the base member includes a first frame area between the first side and the groove portion and a second frame area between the second side and the groove portion,
the groove is located between the first frame area and the second frame area, and
a thickness of the base member in a site where the groove is formed is less than a thickness of the base member in a site overlapping the first frame area and the second frame area.

17. The flexible printed circuit board of claim 15, further comprising:
a bend start point extending along the first direction, in the bend portion,
wherein
the groove portion comprises a first groove portion overlapping the bend start point and extending along the first direction.

18. The flexible printed circuit board of claim 15, further comprising, in the bend portion, a bend start point extending along the first direction and a bend end point extending along the first direction and being apart from the bent start point,
wherein
the groove portion comprises a second groove portion overlapping the bend end point and extending along the first direction.

19. The flexible printed circuit board of claim 15, further comprising, in the bend portion, a bend start point extending along the first direction and a bend end point extending along the first direction and being apart from the bent start point,
  wherein
  one of the groove portions overlaps the bend start point and the bend end point.

20. The flexible printed circuit board of claim 19, wherein the groove portion has a first width along the second direction, and
  the first width is 0.05 to 5 mm.

21. The flexible printed circuit board of claim 15, wherein the groove portion has a second width along the first direction, and
  the second width is 5 to 60 mm.

22. The flexible printed circuit board of claim 16, wherein the first frame area has a third width along the first direction,
  the second frame area has a fourth width along the first direction, and
  the third width and the fourth width each are 0.2 to 5 mm.

23. The flexible printed circuit board of claim 15, wherein in the groove portion, a depth between the second surface and a deepest portion of the concave portions is 0.5 to 32 µm.

24. The flexible printed circuit board of claim 15, wherein the groove portion comprises a plurality of convex portions extending along a second direction intersecting the first direction and arranged along the first direction,
  the plurality of convex portions are each located between each respective adjacent pair of concave portions, and
  a range between the deepest portion of the plurality of concave portions and a top of the plurality of convex portions is 0.5 to 32 µm.

* * * * *